(12) United States Patent
Ozin et al.

(10) Patent No.: US 6,319,427 B1
(45) Date of Patent: Nov. 20, 2001

(54) FAST LUMINESCENT SILICON

(76) Inventors: Geoffrey A. Ozin, 63 Gormley Avenue, Toronto, Ontario (CA), M4V 1Y9; Ömer Dag, Apt. 1402, 10 Walmer Road, Toronto, Ontario (CA), M5R 2W4; Hong Yang, Apt. 1714, 30 Charles Street West, Toronto (CA), M4Y 1R5

( * ) Notice: Subject to any disclaimer, the term of this patent is extended or adjusted under 35 U.S.C. 154(b) by 0 days.

This patent is subject to a terminal disclaimer.

(21) Appl. No.: 09/499,305

(22) Filed: Feb. 7, 2000

Related U.S. Application Data

(62) Division of application No. 09/090,975, filed on Jun. 5, 1998, now Pat. No. 6,027,666.

(51) Int. Cl.$^7$ .................................................. C09K 11/56
(52) U.S. Cl. .......................... 252/301.4 F; 252/301.4 R; 252/582; 252/584; 252/501.1; 502/240; 502/64; 502/63; 423/718; 423/702; 423/704; 423/335
(58) Field of Search .............................. 282/301.4 R, 582, 282/584, 501.1; 502/240, 64, 63; 423/718, 702, 704, 335

(56) References Cited

U.S. PATENT DOCUMENTS

| 5,348,687 | 9/1994 | Beck et al. ........................ 252/582 |
| 6,027,666 | * 2/2000 | Ozin et al. .................... 252/301.4 R |

FOREIGN PATENT DOCUMENTS

WO 96/30951    10/1996    (WO) .

OTHER PUBLICATIONS

Yang, H., Coombs, N. and Ozin, G.A., *Morphogenesis of shapes and surface patterns in mesoporous silica*, Nature, vol. 386, Apr. 17, 1997, pp. 692–695.

Yang, H., Coomb, N. and Ozin, G.A., *Registered growth of mesoporous silica films on graphite*, J. Mater.Chem., 1997, 7(7), pp. 1285–1290.

Yang, H., Coombs, N., Sokolov, I. and Ozin, G.A., *Free-standing and oriented mesoporous silica films grown at the air–water interface*, Nature, vol. 381, Jun. 13, 1996, pp. 589–592.

Yang, H., Coombs N. and Ozin, G.A., *Mesoporous silica with Micrometer–Scale Designs*, Adv. Materials, 1997, 9, No. 10, pp. 811–814.

(List continued on next page.)

Primary Examiner—C. Melissa Koslow
(74) Attorney, Agent, or Firm—Robert G. Hirons

(57) ABSTRACT

There are provided mesoporous silica materials containing in their pores stabilized clusters of silicon atoms, of size 2 nanometers or less, and capable of photoluminescence to emit fast photons. They are prepared by chemical vapour deposition of silicon or a silicon precursor such as disilane, under soft conditions such as temperature of 100–150° C., into the mesopores of silicate films which have mesoporous channels prepared by growth of the films using a template to control their sizes, but without removing the template residues from the films prior to the chemical vapour deposition. The template residues serve to limit the size of the silicon clusters which conform. The use of the soft conditions on CVD retains the template residues in an intact, substantially unchanged form. The resultant films have clusters of silicon, of 2 nanometer size or less, anchored to the mesopores, and air stable, so that they can be used in optoelectronic devices in conjunction with standard silicon semiconductors.

5 Claims, 6 Drawing Sheets

OTHER PUBLICATIONS

Yang, H., Kuperman, A., Coombs, N., Mamiche–Afara, S. and Ozin,G.A., *Synthesis of oriented films of mesoporous silica films on mica*, Nature, vol. 379, Feb. 22, 1996, pp. 703–705.

Coombs,N., Khushalani,D., Oliver,S., Ozin,G.A., Shen, G.C., Sokolov,I. and Yang,H., *Blueprints for inorganic materials with natural form:inorganic liquid crystals and a language of inorganic shape*, J.Chem.Soc., Dalton Trans., 1997, pp. 3941–3952.

Dag,O.,Kuperman,A. and Ozin,G.A., *Germanium Nanoclusters:Chemical Vapor Deposition of Digermane in Zeolite Y and Mordenite*, Advanced Materials., 1994,6, No. 2, pp. 147–150.

Dag,O.,Kuperman,A. and Ozin,G.A., $Si_{1-x}Ge_xY$ Alloy Nanocluster Materials Chemical Vapor Deposition of $Si_2H_6$/$Ge_2H_6$ *Mixtures in Zeolite Y*, Mat.Res.Soc.Symp.Proc. vol. 358, 1995, Materials Research Society, pp. 87–92.

Canham,L.T., *Silicon quantum wire array fabrication by electrochemical and chemical dissolution of wafers*, Appl. Phys. Lett. ,57(10), Sep. 3, 1990, pp. 1046–1048.

Zhao et al., *Triblock copolymer syntheses of mesoporous silica with periodic 50 to 300 angstrom pores*, Science, vol. 279, Jan. 23, 1998, pp. 548–552.

Lehmann et al., *Porous silicon formation: A quantum wire effect*, Appl.Phys.Lett., 58(8), Feb. 25, 1991, pp. 586–858.

Tang et al., *SiGe quantum dots prepared on an ordered mesoporous silica coated Si substrate*, Appl.Phys.Lett., 71 (17), Oct. 27, 1997, pp. 2448–2450.

Chomski et al., *New Forms of Luminescent silicon:silicon–silica composite mesostructures*, Chem.Vapor Deposition 1996, vol. 2,No. 1 (1996), pp. 8–13.

* cited by examiner

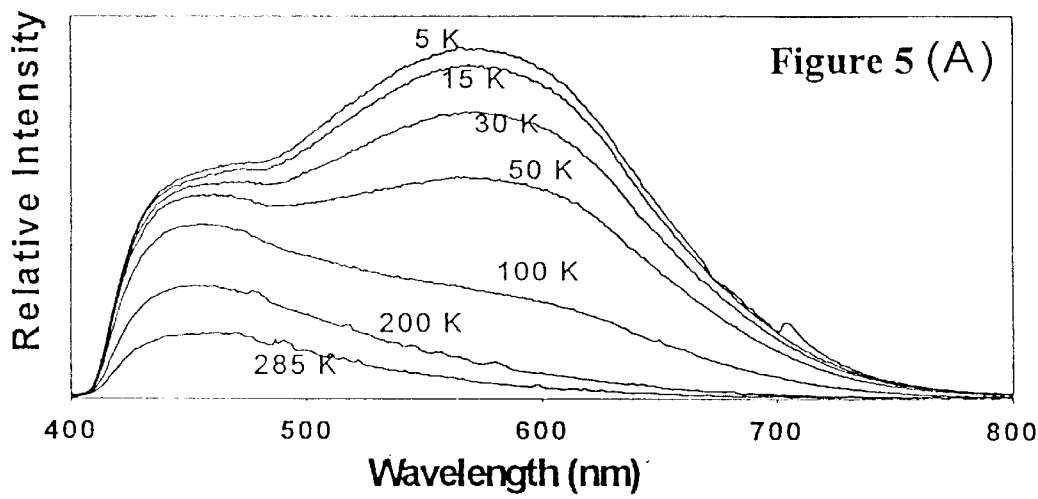
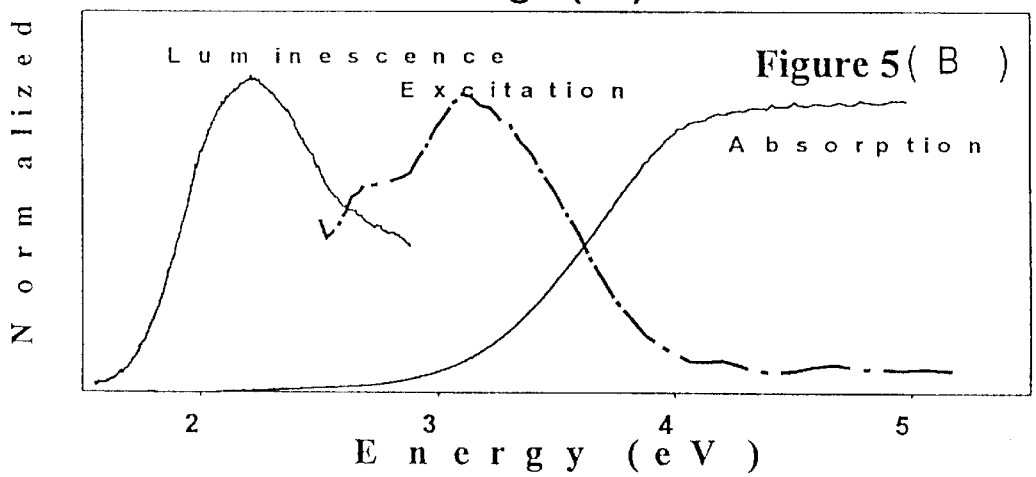
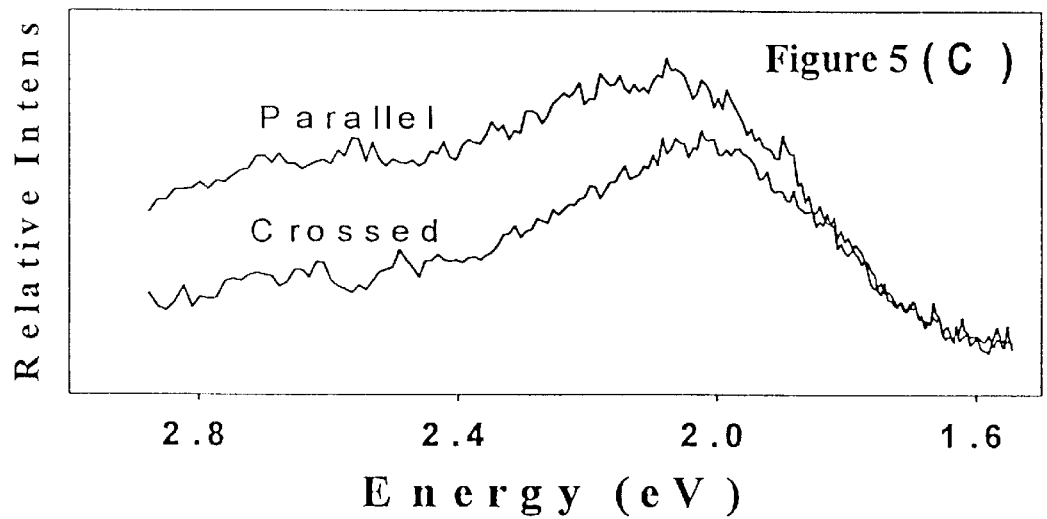

FAST LUMINESCENT SILICON

CROSS-REFERENCE TO RELATED APPLICATION

This application is a division of U.S. patent application Ser. No. 09/090,975 filed Jun. 5, 1998, issued as U.S. Pat. No. 6,027,666.

FIELD OF THE INVENTION

This invention relates to optoelectronics. More specifically, it relates to novel materials comprising stabilized luminescent silicon clusters of a size less than 2 nanometers, which emit light with nanosecond lifetimes ("fast photons"), and to processes for preparing such materials.

BACKGROUND OF THE INVENTION AND PRIOR ART

Optoelectronics is the term given to the process whereby electricity is inputted to a substance and light is outputted from the substance as a consequence. From the time crystalline silicon was recognized as the dominant material in microelectronics, there has been intensive research to develop light emission from silicon, to enable the development of silicon-based light emitting devices (LEDs) for optoelectronics. Under normal circumstances and conditions, silicon is an indirect band gap semiconductor, unable to emit light efficiently or fast. However, fast emitting photons move at a speed which is about 1000 times that of electrons. Moreover, photons are not affected by magnetic fields, and photon beams can cross one another without mutual interference. These features provide great incentive to develop photonics in place of electronics in many applications. Accordingly, the quest for light emitting silicon-based materials, capable of emitting light efficiently and fast, remains a major research activity.

Canham, L. T. "Silicon Quantum Wire Array Fabrication by Electrochemical Dissolution of Wafers", Appl. Phys. Lett. Vol. 57, pages 1046–1048 (1990) disclosed the efficient room temperature photoluminescence in electrochemically etched silicon or porous silicon. Typically, porous silicon emits light with photon energy twice as large as the band gap energy in crystalline silicon, and the emission can be easily tuned over hundreds of millielectron volts. Electroluminescence in porous silicon has been demonstrated in a variety of devices with an electrolyte, conducting polymer and thin transparent or semitransparent metallic contacts, in a variety of papers.

There are however several potential problems with porous silicon as a source of photoluminescence. Whilst the room temperature photoluminescence quantum efficiency can reach 5%, it degrades in ambient conditions in an hour, mostly caused by high porosity and fragility, unstable hydrogen surface passivation and poor thermal conductivity. The electroluminescence efficiency compared to the photoluminescence efficiency was reported to be more than 100 times less, and the electroluminescence degradation occurs even faster. There are serious problems with the possible integration of porous silicon into standard microelectronic circuitry. Published data indicates that porous silicon is an irregular network of connected silicon nanocrystals with typical sizes of 2–5 nanometers.

Canham, Op. Cit., and Leahmann and Gosele, "Porous Silicon Formation: A Quantum Wire Effect", Appl. Phys. Lett., Vol. 58, pages 856–858 (1990), have suggested that room temperature photoluminescence from porous silicon originates from quantum and spatial confinement effects. The silicon units in porous silicon have a size in the mesoscopic range (2–50 nanometers, nm). Photoluminescence emissions from such unit sizes are in the millisecond—microsecond range, which is too slow for use in LEDs.

It is theoretically predicted that silicon clusters of size 2 nm or smaller (corresponding to clusters of about 20 silicon atoms or smaller) have significantly different electronic properties from larger sized such clusters, and in particular they have much faster photoluminescence, fast enough to be attractive in photoelectronic applications i.e. they are capable of emitting "fast photons".

Yang, Coombs, Sokolov and Ozin, "Nature" Vol. 381, pages 589–592 (Jun. 13, 1996) describe the preparation of oriented mesoporous (pore size 2–5 nanometers, nm, 20–50 Å) silica films grown by surfactant templating at the interface between air and water. The reported films are continuous and are resilient enough to withstand bending, whilst being sufficiently flexible to be transferred onto substrates of different shapes. The films have parallel channels of generally hexagonal cross-section, running predominantly parallel to the surface. They can be prepared under acidic aqueous conditions using carefully controlled mole ratios of water, hydrochloric acid, cationic surfactant and silica source reagent (tetraethylorthosilicate). This mixture is stirred at room temperature and the film is allowed to form under static conditions at the air-liquid interface at 80° C. over a reaction time of minutes to days. The channels are hexagonally close packed with a center-to-center distance of about 5 nm which, allowing for wall thickness, provides channel diameters of about 4 nm. The film forms by a mechanism in which, in the aqueous solution, the silicate building blocks associate with the polar head portion of the surfactant molecules, with the non-polar-hydrophobic tail portions of the surfactant disposed radially inwardly to form a micelle, with a "shell" of silicate building blocks. The silicate building blocks undergo condensation polymerization to form silica, creating hexagonally close packed channels with silica walls.

It is an object of the present invention to provide novel photoluminescent silica-silicon materials capable of fast photon emissions.

It is a further object of the invention to provide methods of preparing such materials.

SUMMARY OF THE INVENTION

According to a first aspect of the present invention, there are provided inorganic, mesoporous electrically insulating materials containing in their pores stabilized clusters of silicon atoms, of size two nanometers or less, and capable of photoluminescence to emit fast photons.

According to another aspect of the present invention, there is provided a process for making inorganic mesoporous electrically insulating materials having clusters of silicon atoms bound and stabilized in the mesopores thereof, said silicon clusters having a size not greater than about two nanometers, which comprises the deposition of atomic silicon or a silicon precursor compound into the mesopores of an inorganic mesoporous insulating material, in the presence of surfactant residues contained in the mesopores, chemically anchoring the so-introduced silicon atoms to the mesopore walls, capping the free, reactive bonds of the silicon and causing clustering of the silicon at the interface with the mesopore walls, to a cluster size not exceeding about 2 nanometers.

BRIEF REFERENCE TO THE DRAWINGS

FIG. 1 of the accompanying drawings is a diagrammatic illustration, in longitudinal cross-section, of a composition of matter according to a preferred embodiment of the present invention;

FIGS. 5A, 5B and 5C are, respectively, the temperature-dependent photoluminescence spectrum, luminescence, excitation and absorption spectra, and the polarized photoluminescence spectrum, of the material of Example 4 below;

DESCRIPTION OF THE PREFERRED EMBODIMENTS

Figure 1:
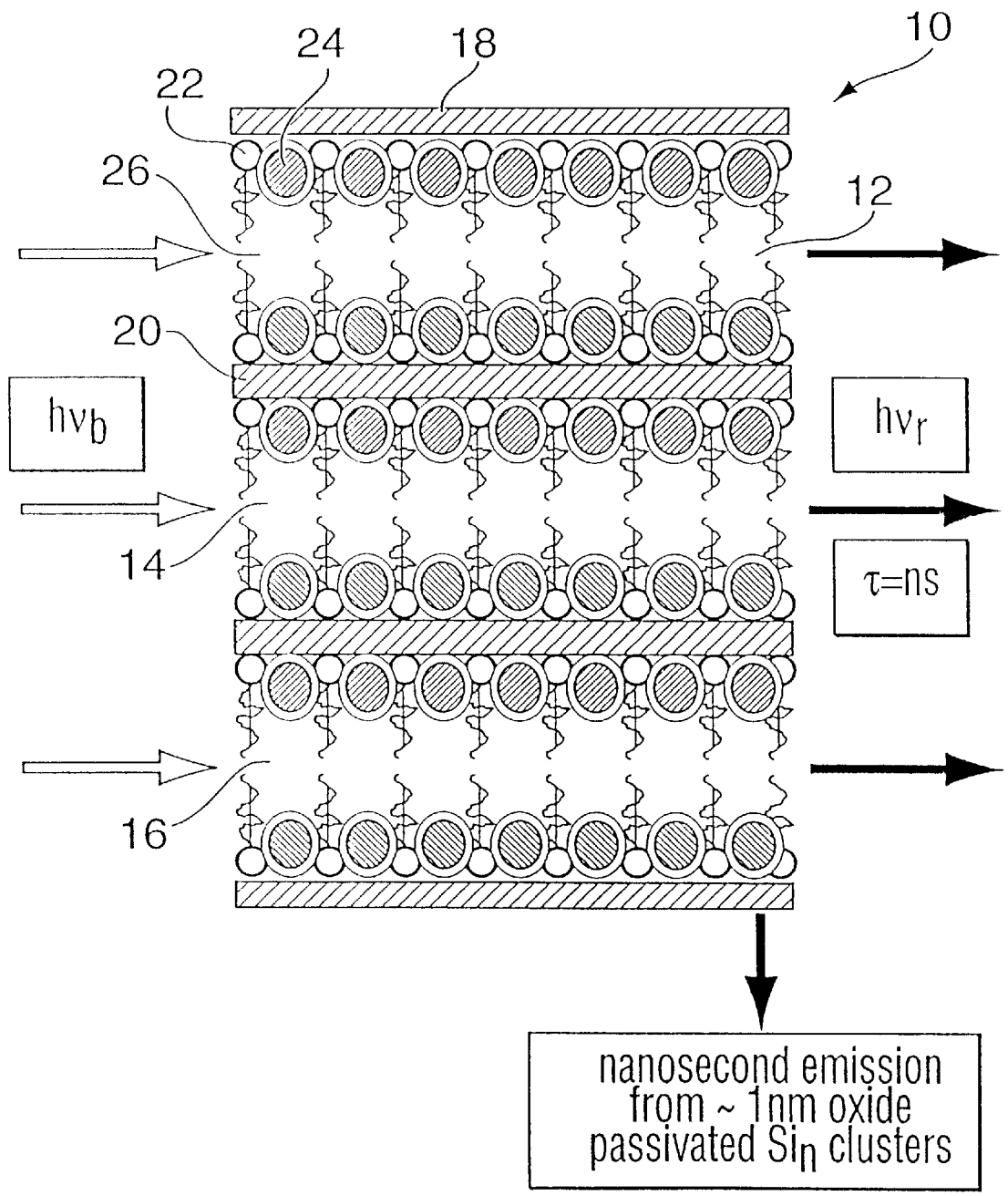

Suitable examples of inorganic, electrically insulating substances for the present invention are silicates, aluminosilicates, aluminophosphates and alumina, to all of which materials the preparative techniques described herein can be applied. Silicate is the preferred such substance, and so the invention will be further described with specific reference thereto, but without limitation thereto.

Previous processes reported by Ozin et al. in papers published in 1996/1998 reported the preparation of such mesoporous films, by using the surfactant template. Prior to undertaking chemical vapor deposition (CVD) of a silicon precursor (disilane, $Si_2H_6$), however, the surfactant was removed from the mesopores. As a consequence, the size to which the silicon clusters could eventually grow was limited only by the size of the mesopores, so that silicon clusters greater than 2 nanometers and larger were formed, which do not exhibit the desirable photoelectronic properties of fast emission. In the present invention, according to one preferred embodiment, the surfactant is left in place. It is disposed within the channels, with the polar head portions at the silica surface. The silane molecules, on introduction by CVD or other appropriate techniques, migrate to the polar surfactant—silica interface, where they react with silanol groups. Here, their potential size growth is limited. The silica sidewalls of the channels have large numbers of residual, attached hydroxy groups resulting from their formation by condensation polymerization. On encountering disilane, the proton of these hydroxide groups and a hydride hydrogen of disilane combine to generate hydrogen, and the silicon bonds to the site of the former hydroxyl group, to anchor the silicon to silica wall structure. Thermal hydrogen elimination causes this reaction to occur and effects clustering of the silicon atoms, with decomposition of the disilane to silicon.

The silicon cluster surface atoms so formed have residual reactive bonds, known as "dangling bonds", containing odd electrons, which are reactive. If left alone, the dangling bond electrons will interfere with the photoluminescence process. When an electron of the silicon absorbs energy to raise it to an excited quantum state, there are several pathways it may follow to lose the energy of excitation, and to revert to the ground state. The emission of photons is only one of these pathways. Others of these pathways are by transferring the energy to the dangling bond sites and by dissipation of that energy into the phonones (or vibrations) of the cluster, ultimately in the form of heat, known as a non-radiative pathway. To maximize the efficiency of the photon emission, therefore, the other non-radiative pathways such as energy transferred by the dangling bond sites should be minimized. This is achieved, in a preferred embodiment of the present invention, by capping this dangling bond with hydrogen and/or oxygen.

Thus, the invention in one embodiment provides nanosecond photoluminescence from silicon clusters in the channels of free-standing oriented hexagonal mesoporous silica film. It also provides a method for their preparation by a new mild chemical vapour deposition procedure. In a preferred embodiment, disilane is anchored to silica channel SiOH wall sites of the oriented hexagonal mesoporous silica film that retains imbibed surfactant template in the channels.

The synthesis of the oriented hexagonal mesoporous silica film is generally as described in Yang, H., Coombs, N. and Ozin, G. A., "Thickness Control and Defects in Oriented Mesoporous Silica Films", J. Mater. Chem. Vol. 8, pages 1205–1211 (1998), which is incorporated herein by reference. Disilane chemical vapor deposition generally as described in previous publications such as Chomski, E., Dag, O., Kuperman, A., Coombs, N. and Ozin, G. A., "New Forms of Luminescence Silicon: Silicon-Silica Composites Mesostructures", Ad. Mater. Chem. Vap. Deposition, Vol. 2, pages 8–13 (1996), and Dag, O., Kuperman, A., and Ozin, G. A., "Germanium Nanoclusters:Chemical Vapour Deposition of Diagermane in Zeolite Y and Mordenite," Adv. Mater. Vol. 6, 147–(1994), both of which disclosures are incorporated herein by reference. However, softer conditions, namely a temperature of 100–150° C. as compared with previously used temperatures of 300° C., can be adopted in processes of the present invention. The softer conditions of CVD in the present invention may be attributed to the fact that the silica of the mesoporous host is partially polymerized and the surfactant template is retained within the channels. These softer conditions of CVD also ensure that substantial numbers of hydroxyl groups remain on the silicate walls of the mesopores, to act as anchoring sites for the silicon clusters The combined effect is that the hydrophobic tails of the imbibed surfactant enable adsorption of disilane into the film, the high population of HO-Si wall sites enhances anchoring of disilane, and clustering of silicon is limited to the available space between surfactants in the channels, thereby effecting limitation on the size to which the clusters can grow, and limiting them to a size of about 2 nanometers or less.

The cluster sizes of the silicon clusters in the materials of the present invention have been confirmed to be of diameter 2 nanometers or less, by 5 different forms of spectroscopic measurements, namely, optical absorbance onset energy, photoluminescence maximum energy, NMR $^{29}$Si chemical shift, Fourier transform Raman frequency shift, and luminescence lifetimes. Preferably the clusters in the materials of the present invention have an average diameter size less than 2 nanometers, e.g. less than 1.8 nm.

The silicon clusters in the materials of the present invention are so small that their photoelectronic properties are changed as compared with those of prior art materials. These changes are characterized by the capability to emit fast photons on photoluminescence. This is as a result of the fact that the clusters are so small that the regular diamond silicon lattice has been altered, modified or strain. It is believed that the normal silicon diamond lattice structure changes when silicon clusters of smaller than 20 nanometers, which correspond to clusters of less than about 20 atoms. This change may be a variation, rearrangement, modification or strain of the regular lattice structure, but in any event has significant effects on the photoelectronic properties such as introducing the ability to emit fast photons.

Referring to FIG. 1 of the accompanying drawings, this diagrammatically illustrates, in cross-section, a thin film according to the present invention, generally designated 10, and comprising three mutually parallel channels 12, 14, 16 extending therethrough. As viewed in end section, FIG. 2, the channels are arranged in a hexagonally close-packed structure.

Each channel is delineated by silica walls such as 18, 20, of approximate thickness 1 nm. The diameter of each channel is of the order of 4 nm.

Inside each channel, and adjacent to the interior wall surface, is a series of surfactant molecules 22 with their hydrophilic head portions adjacent the surface walls 18, 20. Interspersed between the surfactant molecules 22, at their head ends, are silicon clusters 24 of size not greater than about 2 nm. The silicon clusters 24 are constrained in size by the adjacent surfactant molecules 22 and the adjacent channel walls 18, 20 so that they cannot grow to a size above about 2 nm.

Figure 2:
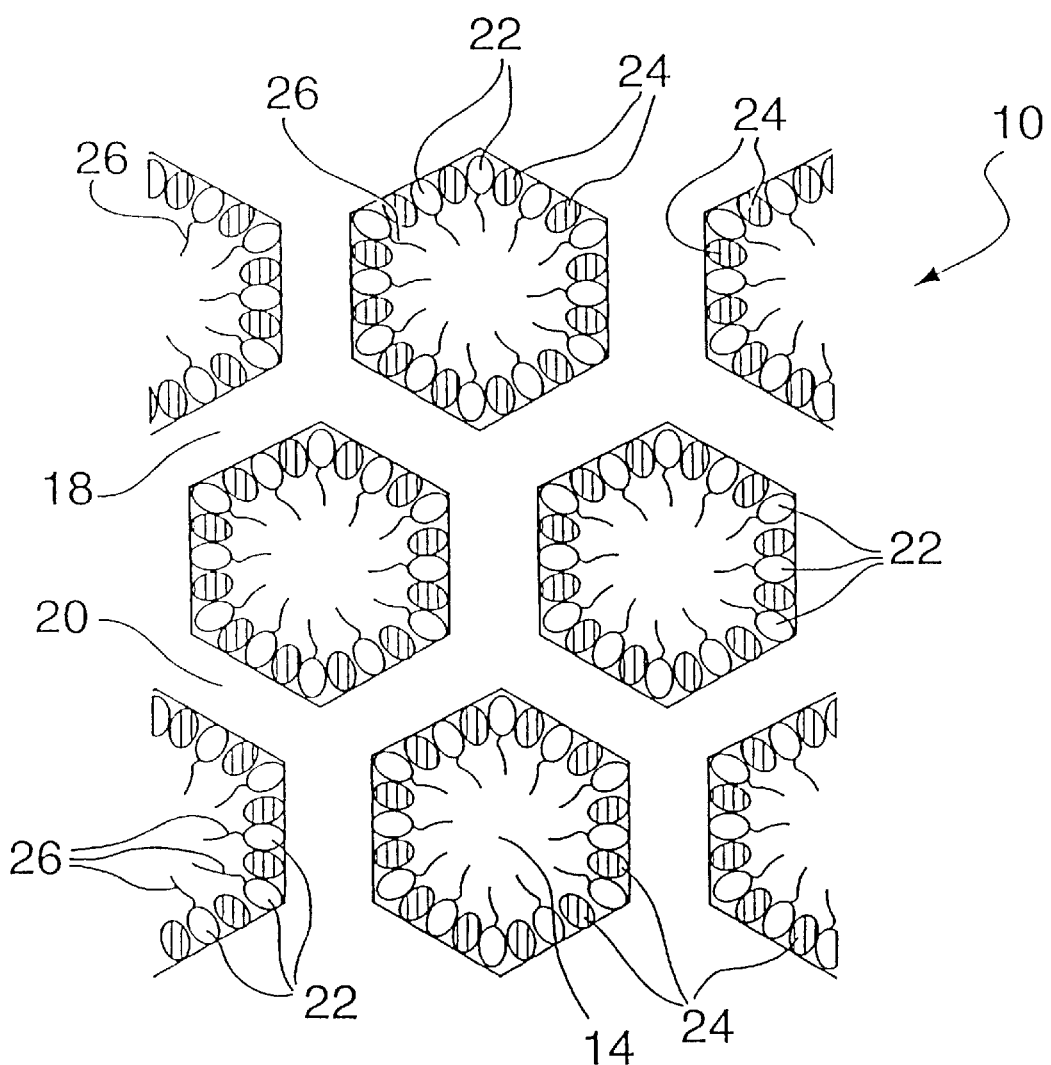
FIG. 2 is a transverse cross-section of the material illustrated in FIG. 1.

The hydrophobic chain portions 26 of the surfactant molecules are disposed in a direction towards the center of each channel 12, 14, 16 etc., as illustrated in FIG. 1 and FIG. 2. In the array as illustrated, they act as spacers and size limiters for the silicon clusters 24. In preparation of the materials according to the invention, as described below, they act as templates, for arranging the pore size and structure of the mesopores in the silicate material.

In preparation of the materials according to the present invention, it is preferred to follow the procedures previously outlined and referenced. A polymerizable silicate derivative such as tetraethylorthosilicate, tetramethylorthosilicate, tetrapropylorthosilicate and the like, a surfactant such as cetyl-trimethyl ammonium chloride and hydrochloric acid in appropriate ratios are mixed in aqueous solution and stirred at room temperature. The hydrochloric acid hydrolyses the ethoxy groups of the tetraethylorthosilicate to hydroxyl groups. The proper adjustment of the molar ratios of the acid, silicate, surfactant and water ensures the formation of film-shaped, solid material at the water-air interface. Other shapes can be arranged by suitable adjustment of these molar ratios. The final mixture is transferred into a plastic bottle of appropriate diameter and allowed to achieve quiescent state. Stirring is limited, so as to retain the micelles intact to promote the formation of films. Mesoporous silica growth is allowed to proceed for a period of hours to days, under static conditions, at room temperature. Depending upon the initial time period and stirring rate for the mixing, different optical birefringence textures are observed.

Alternative, suitable silicate derivatives for use in making the films include alkyl-trialkoxysilicates, such as methyltriethoxysilane which will leave residual methyl groups in the channels which may exert a further space limiting effect on cluster growth; fumed silicas such as Cab-O-Sil, and sodium silicate (waterglass).

In the process, the surfactant forms micelles with the hydrophobic tails directed inwardly and the hydrophilic heads directed outwardly and associated with the silicate particles. A wide choice of suitable surfactants is available, including cationic, neutral, anionic and zwitterionic surfactants, or mixtures thereof. Condensation polymerization of the silicate particles occurs to form silica, in hexagonal close packed tubular form, the hexagonal formation being derived from the templating ability of the surfactant, and the size of the mesopores being determined by the length of the hydrophobic tails on the surfactant. By choice of different surfactants with different lengths of alkyl groups comprising their tails, adjustment of the size and diameter of the mesopores to within about 0.1 nm can be arranged.

Examples of suitable cationic surfactants include alkyl quaternary ammonium salts in which the alkyl chain has from 8 to 30 carbon atoms, for example cetylammonium chloride or bromide cetyltrimethylammonium chloride or bromide; cetylpyridinium chloride or bromide and the like. Suitable neutral, non-ionic surfactants include polyoxyethylene-10-laryl ether. Further control of the size of the micelles formed by the surfactant and hence the size of the mesopores can be exercised by including one or more swelling agents (hydrophobic, inert liquids such as mesitylene or cyclohexane) in the aqueous medium from which the materials are made.

The film may be made in free-standing form. Films so formed may be lifted intact off the water surface. They may be formed on substrates as the films are produced, e.g. by placing the substrate on top of the aqueous liquid surface so that micelles at the liquid surface effect adhesion to the substrate surface as the film forms. They may be used as self-supporting films, or subsequently mounted on a substrate such as mica, silicon in the form of a silicon chip, graphite and the like. The film is dried before proceeding further.

After formation of the film, silicon or a silicon precursor (monosilane $SiH_4$, disilane $Si_2H_6$, trisilane $Si_3H_8$ and the like) is introduced into the mesopores by a process of chemical vapor deposition. The general technique is as previously described and referenced. Temperatures of about 140° C. are used in the CVD step of the present invention, and the residual surfactant is not removed. The loading of silicon into the mesochannels is controlled by the pressure of disilane or other silicon precursors supplied, and by the time of exposure and the temperature at which the silicon material is supplied. The CVD introduction of the disilane effects thermal treatment of the samples to induce a series of dihydrogen elimination and silicon clustering reactions, and capping reactions by hydrogen and oxygen. Accordingly all these processes can be accomplished in a single step at 100–150° C., conferring significant economic advantages on the process of the invention. This suitably involves heating the sample to about 150° C.

Previous processes of preparing such films, referenced earlier, involved a step of driving out the surfactant, template residues from the mesopores of the film structure. This was accomplished by heating the films, e.g. to a temperature of about 550° C. In addition to driving out the surfactant residues, however, this also had the effect of removing the hydroxyl groups from the inner pore surfaces of the silica film, thereby losing potential chemical anchoring sites for the subsequently introduced silane compound. The process of the present invention involves no such step. The films are simply removed from the liquid preparation medium and dried to remove residual water, e.g. by air drying at room temperature and then by vacuum dehydration at 100–150° C. The surfactant template residues remain in place, and perform the function of limiting the size to which the subsequently formed silicon clusters can grow, to a size of 2 nm or less. In addition, the omission of the high-temperature heating step results in the retention of hydroxyl anchoring sites for the silicon precursor (normally disilane) in the silica pores, for higher loading of the films with silicon clusters of the appropriate, nanometer size.

The residual surfactant in the mesopores of the silica films of the present invention, after the film has been formed, acts effectively as a size-limiting barrier material. It is chemically inert, as regards the vapour deposition process of introduction and anchoring of the disilane or other silicon precursor, and as regards the formation of the silicon clusters, except to limit their growth. It is inert in the subsequent photoluminescence of the cluster-containing films. It has a major, active role to play in the formation of the pore structure of the films, as previously described, but only a passive role to play in the subsequent preparation of the silicon clusters and in the uses of the materials in optoelectronic devices. Accordingly, the residual surfactant in the materials of the present invention can be substituted by other inert materials which will adopt the same position and location within the mesopores of the film, to limit the sizes of the silicon clusters. Thus other methods of making the films of the present invention using templates other than surfactants, and which will leave appropriate inert residues and fulfill the size-limiting function described above, are within the scope of the invention. Examples of such materials include block copolymers such as those disclosed in Science 1998, Vol. 279, page 548, Stucky, G. D. et al. Preferred are those which act as templates to limit pore sizes to diameters less than about 10 nm, so as to encourage formation of clusters of very small size. Similarly, materials comprising mesoporous silica films prepared using surfactant templates but from which the surfactant residues have been removed and replaced by other molecules performing the same size-limiting function for the silicon clusters, are also within the scope of the present invention.

The present invention also embraces the co-deposition of other metals such as germanium along with the silicon, effectively to tune the band gap between the excited state and the ground state of the electrons within the clusters in the material. Silicon in bulk form is an indirect band gap semiconductor, meaning that the process of creation of photonic emissions as an electron reverts from an excited state to a ground state is of low probability and inefficient. The optoelectronics of silicon can be improved by reducing the size of the silicon units down to the nanometer range and by making co-clusters of silicon with other, more efficient optoelectronic materials such as germanium. Methods of chemical vapour co-deposition of mixed materials such as silicon and germanium are known in the art (see for example Dag, O., Kuperman, A., and Ozin, G.A., *Mater. Res. Soc. Symp. Proc.*, Vol. 358, 87–92 (1995), incorporated herein by reference).

The provision of air-stable silica films containing nanometer-sized clusters of silicon atoms according to the present invention allows the manufacture of optoelectronic devices based on silicon/silica emission structures, compatible with existing silicon-silica semiconductor manufacturing procedures and facilities. Once silicon clusters in the nanometer size range can be produced in films exhibiting reasonably good structural integrity, and air stability, as in the present invention, one can avoid the use of efficient photoemitters such as gallium arsenide, the previously preferred candidate material for optoelectronic use. While gallium arsenide is an efficient photoemitter, it is a most unpleasant, toxic material to prepare and handle, and it is not compatible with silicon devices currently in mass production and for which fabrication techniques are well established. Materials of the present invention show significant advantages in this respect.

Figure 3:
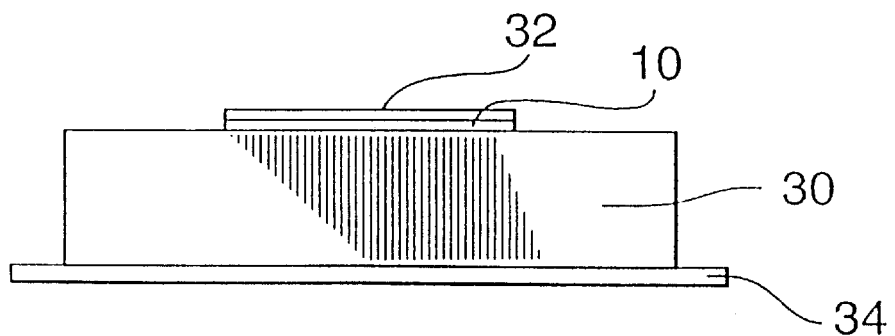
FIG. 3 is a diagrammatic illustration of an optoelectronics unit incorporating a material according to the invention.

Films according to the present invention may be incorporated into a wide variety of optoelectronic devices, for example in association with fibre-optic transmission systems. An example of a structure incorporating a film according to the invention is diagrammatically illustrated in accompanying FIG. 3, a cross-sectional view. The film 10 according to the invention is mounted on a silicon semiconductor 30 and overlaid by an optically transparent electrode 32, e.g. a thin layer of gold, indium/tin oxide, etc., of known type. A metal electrode 34 underlies the silicon semiconductor 30. Application of appropriate current and/or voltage across the electrode 32, 34 causes electroluminescence from the film 10.

Whilst the preferred embodiment of the invention described and illustrated herein in detail is a mesoporous silica film having close-packed hexagonal pores extending generally parallel to the surface of the film, the invention is not limited to such structures. As mentioned previously, other shapes and structures (morphology) can be made which contain suitable mesopores for reception and anchoring therein of appropriately sized silicon clusters for the present invention. The hexagonal, close-packed arrangment of channels in the film-shaped embodiments of the invention is also an optional feature. A variety of other shapes and orientations of the mesoporous channels can be made as the film is prepared, by controlling the growth of the films. The preparation and control of growth of such films, and the preparation of other shapes, is described in G. A. Ozin et al., "Blueprints for Inorganic Materials with Natural Form: Inorganic Liquid Crystals and a Language of Inorganic Shape", J. Chem. Soc. Dalton Trans., 1997, pages 3941–3952. Other such shapes, structures and morphologies include cubic; disordered (molten or sponge-like); lamellar, parallel sheets; and fibers, in which the mesopores run in the longitudinal direction to form luminescent optical fibers or light pipes, containing fast-luminescent silicon. All such structures have the common feature of containing mesopores with a narrow size distribution (mono-dispersity).

Powder forms of the product can also be made, in which particles of silica with mesopores therein are prepared, e.g. by agitation of the solutions described herein for forming films, followed by introduction of silicon as a silicon precursor into the mesopores as described.

Moreover, chemical vapour deposition (CVD) is not the only method useful for introducing silicon or a silicon precursor into the mesoporous channels, in accordance with the invention. Other useful techniques include laser beam vaporization of silicon directly into the material.

The preparation of the materials according to the present invention in the presence of a substrate so that they deposit on the substrate as they are formed, described above, can be adapted to deposit the film by lithographic patterning, to make integrated circuits. Thus the substrates, such as mica, can be chemically pre-treated in a predetermined pattern so that the materials of the invention deposit thereon in the predetermined pattern as they form.

The materials of the present invention can be made in the absence of surfactant or block copolymer templating, e.g. by the sol gel process known in the art, followed by introduction of silicon by CVD or other techniques. The mesopores of such products of the sol gel process can be treated, prior to introduction of silicon, to absorb controlled quantities of inert materials such as surfactants or block copolymers into the mesopores to restrict the subsequent cluster size growth.

The invention is further described, for illustrative purposes, with reference to the following specific examples.
Specific Description of the Most Preferred Embodiments

EXAMPLE 1

5.89 g of a cetyltrimethylammonium chloride (CTACl) solution (29%) was mixed with 4.92 g of a HCl solution (36%) and 81.50 g of water. To this mixture was added 1.36 g of tetraethylorthosilicate (TEOS). The resultant mixture was stirred for 10 minutes at room temperature and then transferred to a polypropylene bottle. The mixture was set in a quiescent state at room temperature for about 11 days. The free-standing film grown at the air-water interface was transferred to a substrate and dried in air. The disilane deposition was carried out in quartz or glass vacuum sealed cells by dehydration of the film from 25° C. to 100° C. for 2 hours and 3 hours at 100° C. Then 40 mg of disilane was introduced and the reaction cell was heated to 125° C. for 30 minutes and at 125° C. for 15 hours. The resulting film sample is yellow in color and photoluminescent in the visible spectral region. The powder X-ray diffraction pattern of partly ground disilane deposited film clearly reveals the $d_{100}$, $d_{110}$ and $d_{200}$ reflections at 40.8 Å, 23.7 Å, and 20.6 Å, respectively, diagnostic of a hexagonal mesoporous silica structure. FTIR microscopy spectra of the samples display vSiH diagnostic bands of surface-passivated silicon clusters.

EXAMPLE 2

Figure 4:
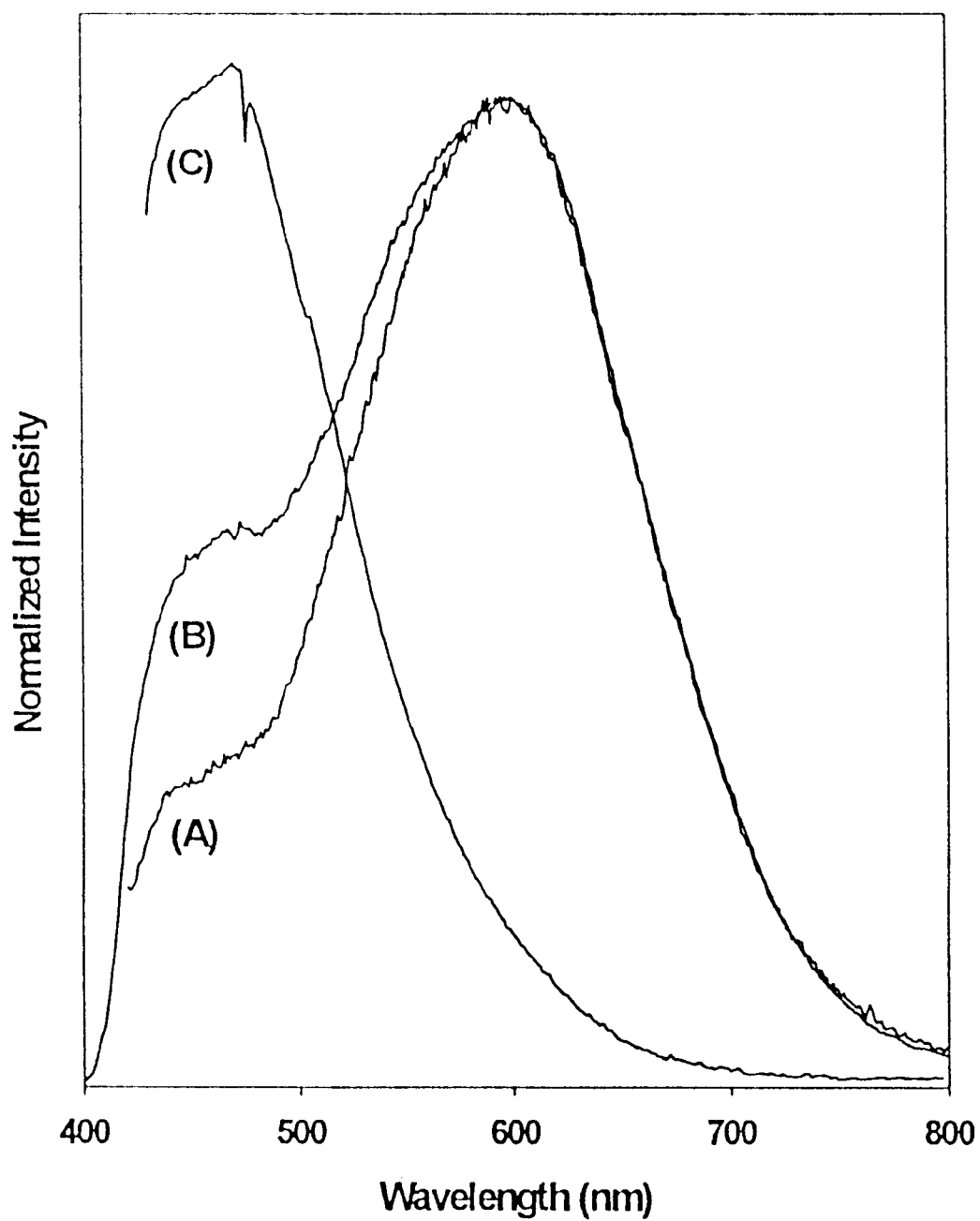
FIG. 4 is the photoluminescence spectra of various materials from Example 2 below.

5.89 g of a cetyltrimethylammonium chloride (CTACl) solution (29%) was mixed with 4.92 g of a HCl solution (36%) and 81.50 g of water. To this mixture was added 1.36 g of tetraethylorthosilicate (TEOS). The resultant mixture was stirred for 10 minutes at room temperature and then transferred to a high density polyethylene bottle. The mixture was set in a quiescent state at room temperature for about 11 days. The film grown at the water-HDPE (high density polyethylene) interface was easily peeled off from the HDPP and transferred from the solution to a substrate and dried in air. The disilane deposition was carried out in quartz vacuum sealed cells by dehydration of the film from 25° C. to 100° C. for 2 hours and 3 hours at 100° C. Then 100 Torr of disilane was introduced and the reaction cell was heated at 140° C. for 40 hours. The color of the resulting sample was yellow-orange in color. Photoluminescence (PL) has been observed for the films. The PL spectrum is shown in FIG. 4. On this Figure, curve A derives from a film sample of thickness about 10 microns, containing silicon clusters derived from disilane as described. Curve B derives from a similar film, but of thickness about 3 microns. Curve C derives from a similar film which had not been treated with disilane, and so contained no silicon clusters. FTIR displayed vSiH diagnostic modes of surface-passivated silicon clusters at around 2000–2300 $cm^{-1}$.

EXAMPLE 3

5.83 g of a cetyltrimethylammonium chloride (CTACl) solution (29%) was mixed with 4.94 g of a HCl solution (36%) and 81.54 g of water. To this mixture was added 1.37 g of tetraethylorthosilicate (TEOS). The resultant mixture was stirred for 10 minutes at room temperature and then transferred to a polypropylene bottle. The mixture was set in a quiescent state at room temperature. The free-standing film grown at the air-water interface was transferred to a substrate and dried in air. The disilane deposition was carried after dehydration of the film sample from 25° C. to 100° C. for 2 hours and 3 hours at 100° C. Then 40 mg of disilane was introduced and the reaction cell was heated for 30 min from 25° C. to 125° C. and 15 hours at 125° C. The resulting film sample was light yellow. Transmission electron microscopy images show the hexagonal mesostructure of the film after deposition.

EXAMPLE 4

5.83 g of a cetyltrimethylammonium chloride (CTACl) solution (29%) was mixed with 4.94 g of a HCl solution (36%) and 81.54 g of water. To this mixture was added 1.37 g of tetraethylorthosilicate (TEOS). The resultant mixture was stirred for 10 minutes at room temperature and then transferred to a HDPE bottle. The mixture was set in a quiescent state at ambient room temperature. The film grown at the water-HDPE interface was easily peeled off from the HDPE and was transferred from the solution to a substrate and dried in air. The disilane deposition was carried out in quartz vacuum sealed cells by dehydration of the film from 25° C. to 100° C. for 2 hours and 3 hours at 100° C. Then 30 Torr of disilane was introduced and the reaction cell was heated at 140° C. for 40 hours. The resulting film samples are yellow in color and yield orange PL. Temperature dependent PL, absorption-excitation-emission and polarized photoluminescence PL spectra are shown in FIG. 5 characteristic of surface-passivated ~1 nm silicon clusters in the mesoporous silica film.

EXAMPLE 5

5.89 g of a cetyltrimethylammonium chloride (CTACl) solution (29%) was mixed with 4.92 g of a HCl solution (36%) and 81.50 g of water. To this mixture was added 1.36 g of tetraethylorthosilicate (TEOS). The resultant mixture was stirred for 10 minutes at room temperature and then transferred to a polypropylene bottle. The mixture was set in a quiescent state at ambient room temperature for about 11 days. The film grown at the water-HDPE interface can easily peel off from the HDPE and was transferred from the solution to a substrate and dried in air. The disilane deposition has been carried in a quartz vacuum sealed cell by dehydration of the film from 25° C. to 100° C. for 2 hours and 3 hours at 100° C. Then 100 Torr of disilane was introduced and the reaction cell was heated at 140° C. for 18 hours.

EXAMPLE 6

5.89 g of a cetyltrimethylammonium chloride (CTACl) solution (29%) was mixed with 4.92 g of a HCl solution (36%) and 81.50 g of water. To this mixture was added 1.36 g of tetraethylorthosilicate (TEOS). The resultant mixture was stirred for 10 minutes at room temperature and then transferred to a high density polyethylene bottle. The mixture was set in a quiescent state at room temperature for about 11 days. The film grown at the water-HDPE interface can easily peel off from the HDPE and was transferred from the solution to a substrate and dried in air. The disilane deposition has been carried out in quartz vacuum sealed cells by dehydration of the film from 25° C. to 100° C. for 2 hours and 3 hours at 100° C. Then 100 Torr of disilane was introduced and the reaction cell was heated at 140° C. for 24 hours. The color of the sample was bright yellow and yielded visible photoluminescence. For further deposition the reaction cell was evacuated and fresh 100 Torr of disilane was introduced and the reaction cell was heated for another two days at 140° C. The change on the color of the film was negligible.

EXAMPLE 7

Figure 6:
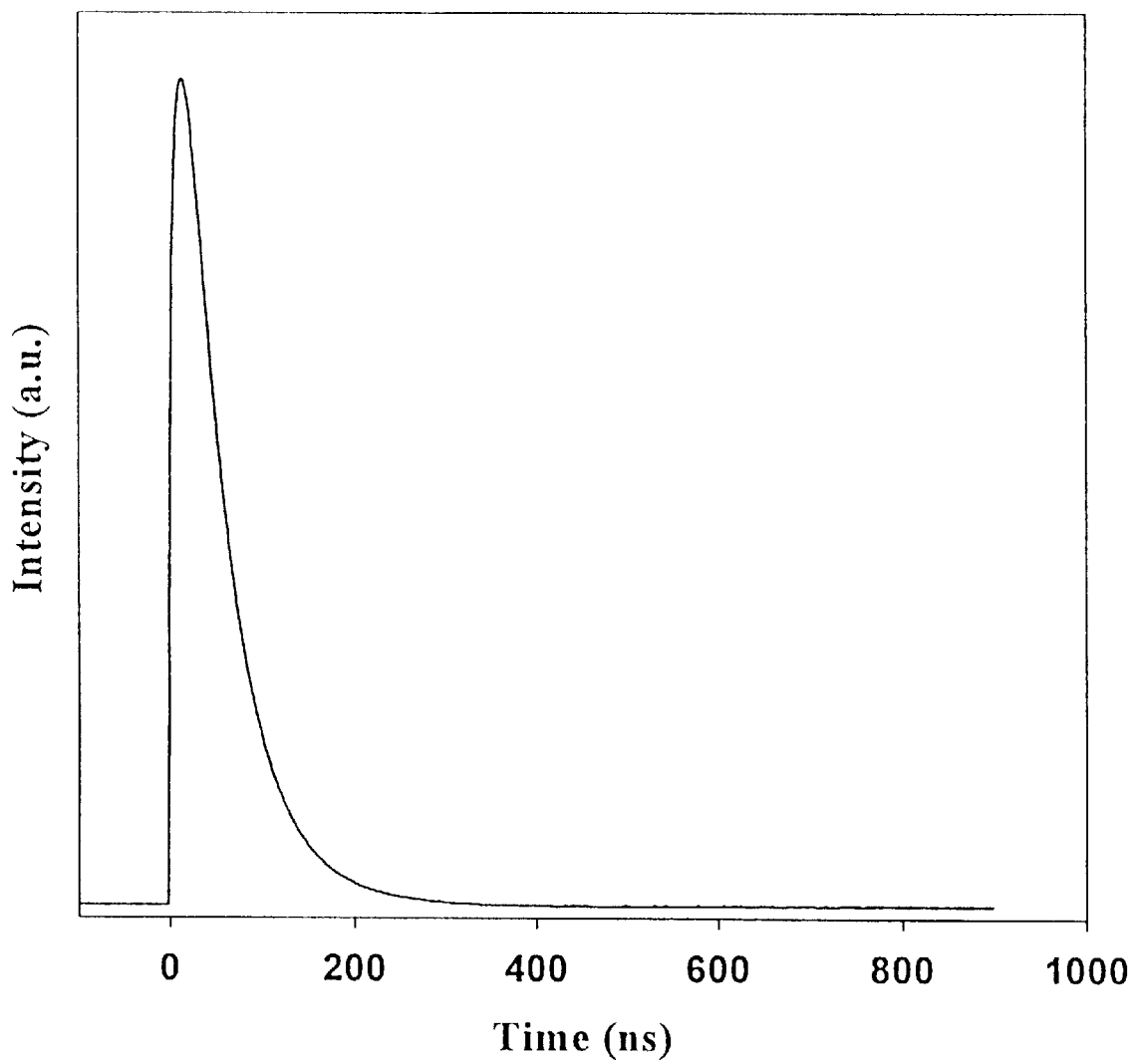
FIG. 6 is the photoluminescence decay curve of the material of Example 7 below.

5.90 g of a cetyltrimethylammonium chloride (CTACl) solution (29%) was mixed with 4.96 g of a HCl solution (36%) and 81.76 g of water. To this mixture was added 1.34 g of tetraethylorthosilicate (TEOS). The resultant mixture was stirred for 10 minutes at room temperature and then transferred to a polypropylene bottle. The mixture was set in a quiescent state at room temperature for about 10 days. The free-standing film grown at the air-water interface was transferred to a substrate and dried in air. The disilane deposition was carried out in a quartz vacuum sealed cell by dehydration of the film from 25° C. to 100° C. for 2 hours and 3 hours at 100° C. Then 100 Torr of disilane was introduced and reaction cell was heated at 140° C. for 40 hours. The color of the film sample was yellow and photoluminesced in the visible spectral region. The photoluminescence lifetime of the silicon clusters in the film was recorded at 80 K at 655 nm, FIG. 6. The mean lifetime was found to be around 60 ns diagnostic of ~1 nm surface-passivated silicon clusters in the film.

EXAMPLE 8

Figure 7:
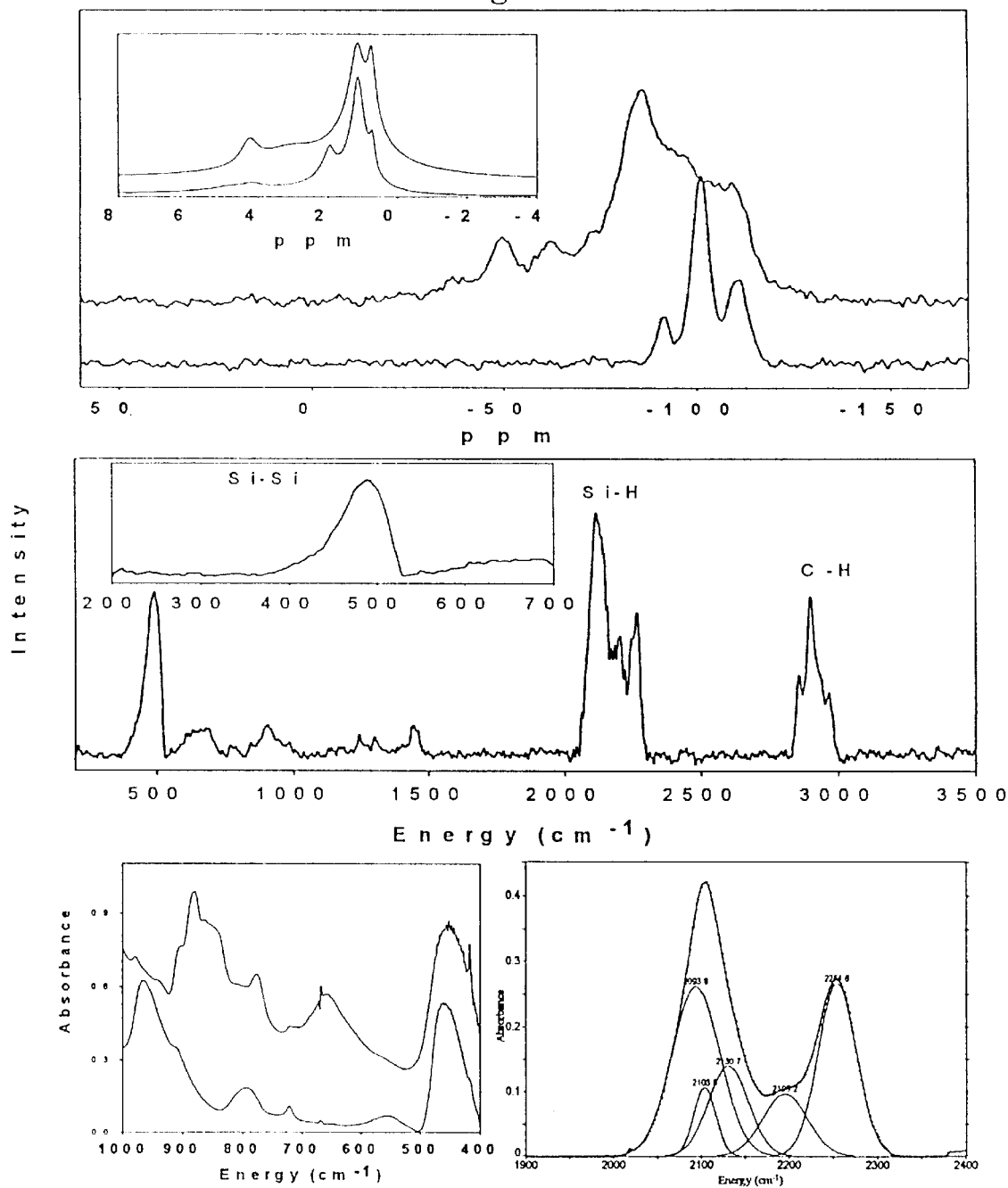
FIG. 7 is the $^{29}$Si and $^1$H NMR, FT-Raman and IR spectra of the material of Example 8 below.

5.83 g of a cetyltrimethylammonium chloride (CTACl) solution (29%) was mixed with 5.02 g of a HCl solution (36%) and 81.51 g of water. To this mixture was added 1.32 g of tetraethylorthosilicate (TEOS). The resultant mixture was stirred for 10 minutes at room temperature and then transferred to a polypropylene bottle. The mixture was set in a quiescent state at ambient room temperature for about 7 days. The free-standing film grown at the air-water interface was transferred to a substrate and dried in air. The disilane deposition was carried out on ground film samples in a quartz vacuum sealed cell by dehydration of the film from 25° C. to 100° C. for 2 hours and 3 hours at 100° C., after dehydration the amount of the sample was 55 mg. Then 100 Torr of disilane was introduced and the reaction cell was heated at 140° C. for 40 hours. Deposition was 27 mg. It displayed intense visible PL. $^{29}$Si and $^{1}$H NMR, FT-Raman and IR spectra (FIG. 7), PXRD patterns and TEM images were collected and characterized ~1 nm surface-passivated silicon clusters in the mesoporous silica film. On FIG. 7, the top curves are $^{29}$Si-NMR and $^{1}$H-NMR, with the upper curve derived from the silicon cluster-containing film and the lower curve from the non-silane treated film. The curves in the inset portion are an enlargement of the silicon-proton region of the curves. The middle curve is the FT-Raman spectrum, the inset being an enlargement of the Si-Si region of the curve. The bottom curves are the IR spectra, the lower left curves derived from (upper curve) a silicon cluster-containing film and from (lower curve) an untreated film. The lower right graphs show the fitting of the curves.

EXAMPLE 9

5.89 g of a cetyltrimethylammonium chloride (CTACl) solution (29%) was mixed with 4.92 g of a HCl solution (36%) and 81.50 g of water. To this mixture was added 1.36 g of tetraethylorthosilicate (TEOS). The resultant mixture was stirred for 10 minutes at room temperature and then transferred to a polypropylene bottle. The mixture was set in a quiescent state at room temperature for about 11 days. The film grown at the water-HDPP interface can easily peel off from the HDPP and was transferred from the solution to a substrate and dried in air. The disilane deposition was carried in a quartz vacuum sealed cell by dehydration of the film from 25° C. to 100° C. for 2 hours and 3 hours at 100° C. Then 100 Torr of disilane was introduced and reaction cell was heated at 140° C. for 40 hours. The color of the film sample was yellow and photoluminesced in the visible spectral region.

What is claimed is:

1. Inorganic, mesoporous, electrically insulating material in the form of a film and containing in the mesopores thereof stabilized clusters of silicon atoms, of average diameter size 2 nanometers or less and including template residues within the mesopores and separating individual clusters of silicon atoms, said clusters being capable of elecotroluminescence on application of appropriate current or voltage across the film, to emit fast photons.

2. Material according to claim 1, wherein the inorganic material is silica, aluminosilicate, aluminophosphate or alumina.

3. Material according to claim 1, wherein the inorganic material is silica.

4. Mesoporous silica materials as claimed in claim 3, wherein the mesopores comprise channels extending generally parallel to the film surface.

5. Material according to claim 1, additionally including germanium atoms in the clusters of silicon atoms, to form silicon-germanium co-clusters.

* * * * *